(12) United States Patent
Gengler

(10) Patent No.: US 11,924,990 B2
(45) Date of Patent: *Mar. 5, 2024

(54) PROTECTIVE COVER FOR PORTABLE ELECTRONIC DEVICE AND ASSOCIATED SYSTEMS AND METHODS

(71) Applicant: ZAGG Inc, Midvale, UT (US)

(72) Inventor: David Gengler, Draper, UT (US)

(73) Assignee: ZAGG Inc, Midvale, UT (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/488,109

(22) Filed: Sep. 28, 2021

(65) Prior Publication Data

US 2022/0095470 A1 Mar. 24, 2022

Related U.S. Application Data

(63) Continuation of application No. 13/920,439, filed on Jun. 18, 2013, now Pat. No. 11,134,580, which is a
(Continued)

(51) Int. Cl.
*H05K 7/00* (2006.01)
*G06F 1/16* (2006.01)
(Continued)

(52) U.S. Cl.
CPC ............. *H05K 7/00* (2013.01); *G06F 1/1626* (2013.01); *G06F 1/1669* (2013.01);
(Continued)

(58) Field of Classification Search
CPC .............. A45C 11/00; A45C 2011/002; A45C 2011/003; A45C 2200/15; G06F 1/1628; G06F 1/1613; G06F 1/1615; G06F 1/1616; G06F 1/1624; G06F 1/166; G06F 1/1626; G06F 1/1632; G06F 1/1679; G06F 1/1669; G06F 1/1667; G06F 1/1637; G06F 1/162; G06F 2200/1633; G06F 3/0231;
(Continued)

(56) References Cited

U.S. PATENT DOCUMENTS 8,422,210 B2 * 4/2013 Moser ................... G06F 1/1654
345/184
10,013,074 B2 * 7/2018 Gengler ................ G06F 1/1637
(Continued)

*Primary Examiner* — Angel R Estrada
(74) *Attorney, Agent, or Firm* — DENTONS Durham Jones Pinegar

(57) ABSTRACT

A protective cover for a portable electronic device includes a support with a support element that includes a slot bounded by a forward surface and an opposed rear surface. The forward surface and the opposed rear surface are planar surfaces oriented parallel to one another and spaced apart a distance that enables the slot to receive peripheral edges of any of a plurality of differently configured devices from different manufacturers and having different capabilities. The forward surface and the opposed rear surface are located a single fixed distance apart from one another, enabling the slot to self-support the plurality of differently configured devices from different manufacturers and having different capabilities. The protective cover may include a keyboard.

17 Claims, 5 Drawing Sheets

Related U.S. Application Data continuation-in-part of application No. 12/954,841, filed on Nov. 26, 2010, now abandoned, and a continuation-in-part of application No. 12/832,845, filed on Jul. 8, 2010, now abandoned.

(60) Provisional application No. 61/661,283, filed on Jun. 18, 2012.

(51) Int. Cl.
  *G06F 3/023* (2006.01)
  *H05K 13/00* (2006.01)

(52) U.S. Cl.
  CPC .......... *G06F 1/1679* (2013.01); *G06F 3/0231* (2013.01); *H05K 13/00* (2013.01); *G06F 2200/1633* (2013.01); *Y10T 29/49002* (2015.01)

(58) Field of Classification Search
  CPC ......... G06F 3/0219; G06F 3/02; F16M 13/00; H05K 5/0086; H05K 7/00; H05K 7/02
  USPC ............ 361/679.01, 679.02, 679.08, 679.09, 361/679.21, 679.26, 679.29, 679.3, 361/679.55, 679.56; 248/157, 176.1, 248/176.3, 346.01, 346.03, 455, 456; 345/156, 168, 173, 169, 649; 312/208.4; 400/472–496

See application file for complete search history.

(56) References Cited

U.S. PATENT DOCUMENTS

| | | | |
|---|---|---|---|
| 11,134,580 B2* | 9/2021 | Gengler | G06F 1/1679 |
| 2010/0238620 A1* | 9/2010 | Fish | G06F 1/1654 |
| | | | 361/679.29 |
| 2012/0243149 A1* | 9/2012 | Gartrell | G06F 1/1654 |
| | | | 361/679.01 |

\* cited by examiner

PROTECTIVE COVER FOR PORTABLE ELECTRONIC DEVICE AND ASSOCIATED SYSTEMS AND METHODS

CROSS-REFERENCE TO RELATED APPLICATIONS

This application is a continuation of U.S. patent application Ser. No. 13/920,439, filed on Jun. 18, 2013 and titled PROTECTIVE COVER FOR PORTABLE ELECTRONIC DEVICE AND ASSOCIATED SYSTEMS AND METHODS ("the '439 Application"), now U.S. Pat. No. 11,134,580, issued on Sep. 28, 2021. The '439 Application includes a claim to the benefit of the Jun. 18, 2012 filing date of U.S. Provisional Patent Application 61/661,283, titled PROTECTIVE COVER FOR PORTABLE ELECTRONIC DEVICE, AND ACCESSORIES, SUPPORT DEVICES AND METHODS ASSOCIATED THEREWITH, ("the '283 Provisional Application"), which was made pursuant to 35 U.S.C. § 119(e). The '439 Application is also a continuation-in-part of U.S. patent application Ser. No. 12/954,841 titled PROTECTIVE COVER FOR A MOBILE COMPUTING DEVICE, SYSTEMS INCLUDING PROTECTIVE COVERS, AND ASSOCIATED METHODS filed on Nov. 26, 2010 ("the '841 Application"), which is a continuation-in-part of U.S. patent application Ser. No. 12/832,845, filed on Jul. 8, 2010 and titled SYSTEM AND APPARATUS FOR PROTECTING A MOBILE DEVICE ("the '845 Application"). The entire disclosures of the '283 Provisional Application, the '841 Application, the '845 Application, and the '439 Application are hereby incorporated herein.

TECHNICAL FIELD

This disclosure relates generally to devices for protecting portable electronic devices, or protective covers. More particularly, this disclosure relates to protective covers that are integrated with peripheral accessories, such as keyboards. The disclosure also relates to protective covers that are configured to support portable electronic devices during use. In addition, systems and methods for protecting, supporting, and using portable electronic devices are also disclosed.

RELATED ART

Since the advent of mobile computing, portable electronic devices have become increasingly portable, easier to use, and more affordable. As a result, the frequency with which portable electronic devices are used, and the circumstances and locations where used, have also experienced significant increases. In fact, users who carry portable electronic devices often access them many times throughout a day, in multiple locations and frequently use more than one portable electronic device.

The portability of portable electronic devices has largely been made possible by advances in technology that enable processors, storage and memory devices, network communication devices, and other computing elements and systems to be ever more powerful (e.g., faster, greater capacity, etc.) without corresponding increases in size. Consequently, portable electronic devices are becoming increasingly more powerful and convenient.

The display elements of many state-of-the-art portable electronic devices include touch-sensitive displays that have input capabilities. The use of touch sensitive displays and other interactive display elements eliminates the need for many mechanical input devices (e.g., keys, buttons, switches, etc.). Nevertheless, interactive display elements are typically sensitive (i.e., more prone to damage than their mechanical counterparts, etc.) and expensive to replace. In addition, since touch-sensitive displays are interactive, they are typically readily accessible and, thus, exposed.

SUMMARY

A protective cover for a portable electronic device, such as a tablet computer, a smart phone or the like, is configured to be positioned and secured in place over a display surface of the portable electronic device. Systems in which such a protective cover is used are also disclosed, as are methods in which such a protective cover may be used.

In various embodiments, a protective cover according to this disclosure may include a housing that may be sized (i.e., have dimensions) and configured to be positioned over a display surface of a particular type of portable electronic device. In some embodiments, the housing of the protective cover may be configured complementarily to the display surface, and/or to a housing of the portable electronic device. The housing and the protective cover include an interior surface that is configured to face and to be positioned against the display surface of the portable electronic device.

In some embodiments, the housing of the protective cover may carry a peripheral device (e.g., a keyboard, etc.) configured for use with the portable electronic device. The peripheral device may be accessible from, and face in the same direction as, or outward from, an interior surface of the housing or the protective cover. An outer surface of the peripheral device, which faces in the same direction as the interior surface of the housing and protective cover, may be coplanar with the interior surface, or recessed beneath the interior surface.

Attachment elements of the protective cover may be configured to mutually engage corresponding attachment elements of a complementary portable electronic device. Such mutual engagement may occur through the display surface. Without limitation, the mutual engagement may comprise magnetic attraction between the attachment elements of the protective cover and corresponding attachment elements of the portable electronic device.

A protective cover may be configured for positioning over a display surface of a portable electronic device without engaging a peripheral edge of the portable electronic device. In some embodiments, the protective cover may be configured to be positioned over the display surface without substantially extending over or covering any peripheral edge of the portable electronic device; i.e., an alignment feature may extend slightly over some or all of one or more peripheral edges of the portable electronic device to facilitate alignment of the protective cover over the display surface of the portable electronic device, but a majority of the thickness of the peripheral edge may remain exposed when the protective cover is assembled over the display surface of the portable electronic device.

Portable electronic device systems include a portable electronic device and a protective cover configured for use therewith. The portable electronic device of such a system may comprise a tablet computer, a smart phone, or the like. The protective cover may include any of the features disclosed above, or any combination of the disclosed features.

Methods for protecting, supporting, and using electronic devices may include use of a protective cover that incorporates teachings of this disclosure. When used to protect an electronic device, an interior surface of a protective cover may be positioned over the electronic device and aligned therewith. In some embodiments, features of the protective cover may mechanically engage corresponding features of the portable electronic device to properly align the protective cover with the portable electronic device. Upon positioning and aligning the protective cover with its interior surface over the display surface of a portable electronic device, and the protective cover and portable electronic device have been assembled with one another, complementary attachment features of the protective cover and the portable electronic device may secure the protective cover in place over the display surface of the portable electronic device. In some embodiments, the complementary attachment features may function through the display surface of the portable electronic device (e.g., when the attachment elements comprise magnets, etc.).

The protective cover may be readily removed from the display surface of the portable electronic device by pulling the protective cover away from the display surface. With the protective cover and the portable electronic device disassembled, the protective cover may be used to support the portable electronic device in an at least partially upright, or "working," orientation (e.g., perpendicularly, at an inclined angle, etc.). More specifically, a peripheral edge of the portable electronic device may be engaged by a support element at the interior surface of the protective cover (e.g., the peripheral edge may be inserted into a slot formed in the interior surface of the protective cover, etc.). The support element and a configuration of the protective cover (e.g., its dimensions, shape, weight, weight distribution, etc.) may hold the portable electronic device in the at least partially upright orientation.

With the portable electronic device in the at least partially upright orientation, any peripheral device of the protective cover (e.g., a keyboard, etc.) may be used to enhance the functionality of the portable electronic device.

Other aspects, as well as the features and advantages of various aspects, of the disclosed subject matter will become apparent to those of ordinary skill in the art through consideration of the ensuing description, the accompanying drawings, and the appended claims.

BRIEF DESCRIPTION OF THE DRAWINGS

Various embodiments of the disclosed subject matter are illustrated by the appended drawings, in which.

DETAILED DESCRIPTION

Examples of portable electronic devices with which a protective cover that incorporates teachings of this disclosure may be used include, but are not limited to, so called "slate" or "tablet" computers, smart phones, hand-held multimedia devices (or "digital media players"), e-readers, or the like. A few examples of "slate" or "tablet" computers include, but are not limited to, the IPAD® products available from Apple, Inc., the XOOM™ tablet computer available from Motorola Mobility, Inc., the BLACKBERRY PLAYBOOK™ available from Research in Motion Limited, the STREAK™ available from Dell Inc., the HP TOUCHPAD™ available from Hewlett-Packard Co., and the GALAXY TAB™ available from Samsung Electronics Co., Ltd. The KINDLE® devices available from Amazon Technologies, Inc. and the NOOK™ devices available from Barnes & Noble, Inc., are examples of e-readers. Examples of smart phones may include, but are certainly not limited to, the IPHONE® devices available from Apple, Inc. and the GALAXY™ devices available from Samsung Electronics Co., Ltd. Some non limiting examples of multimedia devices include the IPOD® and IPOD TOUCH® devices available from Apple, Inc. and any number of additional devices from various manufacturers and having different capabilities. Of course a protective cover may be configured for use with other types of electronic devices as well.

Figure 1:
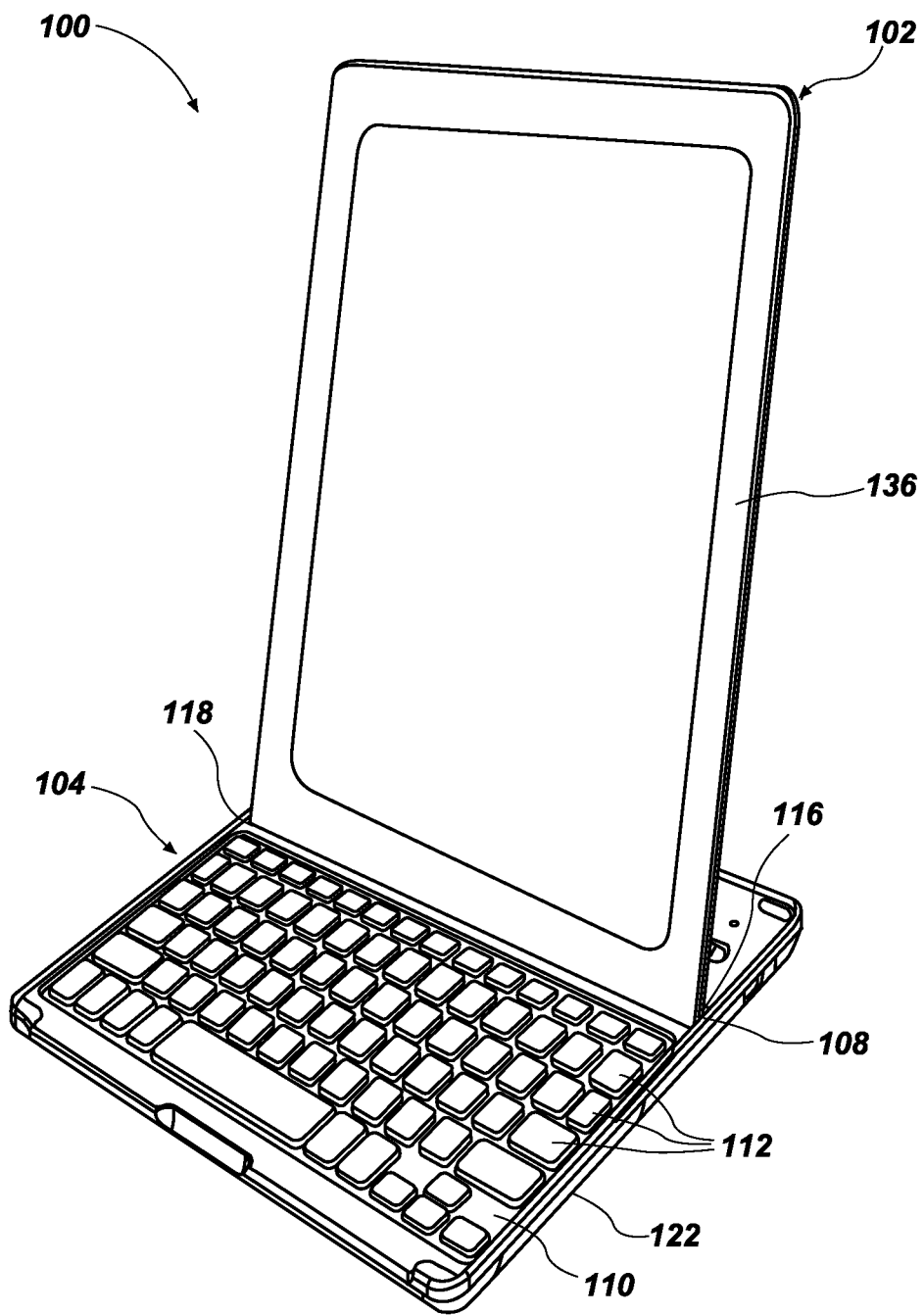
FIG. 1 is a perspective view of an embodiment of a protective cover, in which the protective cover is configured to support, and supports, a portable electronic device in an at least partially upright orientation.
Figure 2:
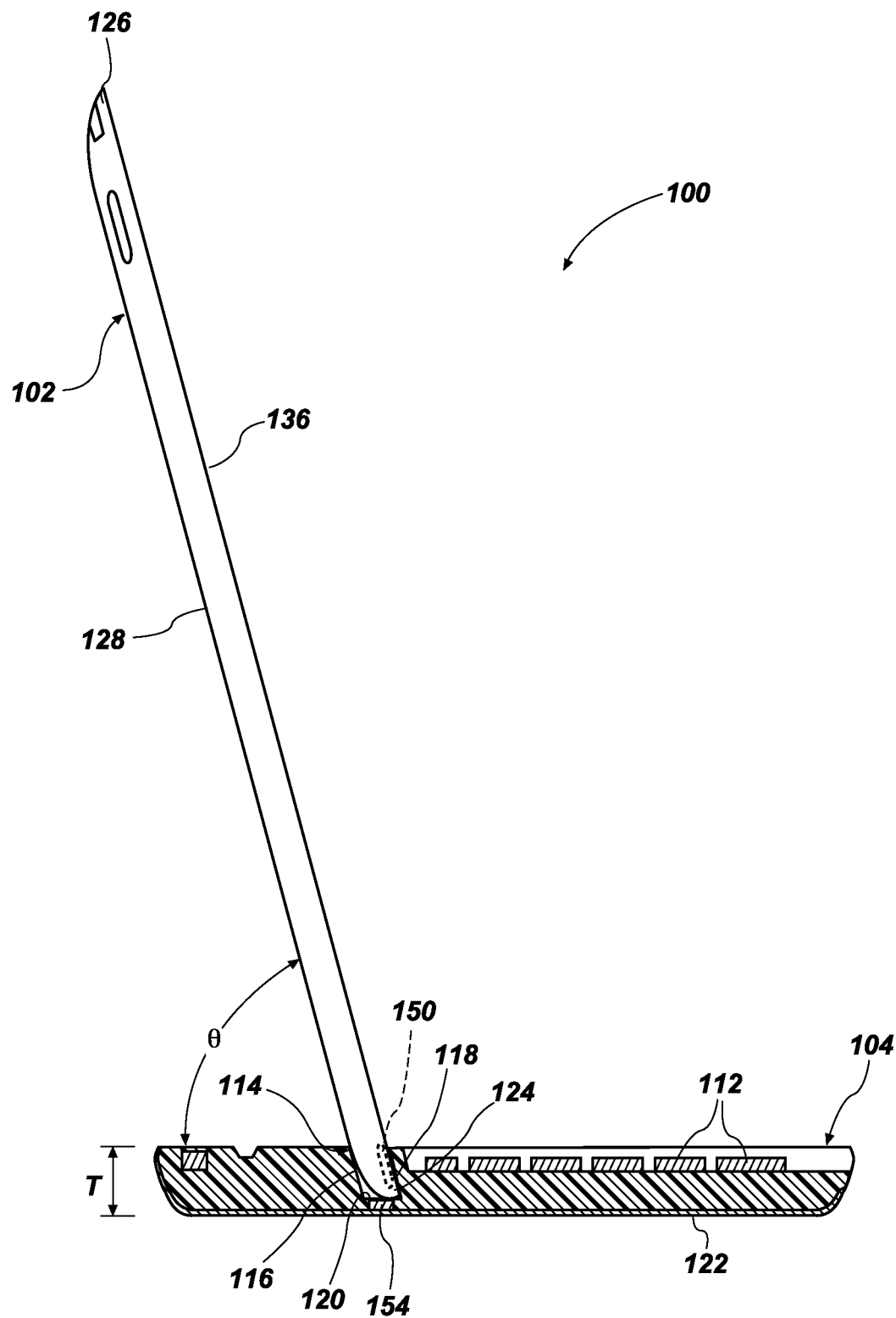
FIG. 2 is a partial cross-sectional side view of the embodiment of protective cover and portable electronic device shown in FIG. 1, illustrating features of an embodiment of support element of the protective cover, which support element holds the portable electronic device in the at least partially upright orientation.

FIGS. 1 and 2 illustrate an embodiment of a protective cover system 100. As shown, the protective cover system 100 may include a protective cover 104 configured (e.g., sized, shaped, etc.) for use with a portable electronic device 102. In some embodiments, the protective cover 104 may be configured for use with a particular type (e.g., brand, model, etc.) of portable electronic device 102.

The protective cover 104 may include one or more accessories 106. In the illustrated embodiment, an accessory 106 of the protective cover 104 is illustrated as comprising a keyboard 110, although other types of accessories may be included in addition to, or instead of, a keyboard 110 (e.g., a wireless keyboard, etc.). The keyboard 110 may have any number of key layouts. For instance, the keyboard 110 may include any number of keys 112, and the keys 112 may be arranged in any desired pattern or other arrangement. For example, the keyboard 110 may include alphanumeric keys arranged in a QWERTY-style layout, while optionally including various keys for directional input, initiating different functions, and the like.

As shown in FIGS. 1 and 2, a protective cover system 100 may include a support element 108. A support element 108 may be configured to support a portable electronic device 102 in one or more inclined, at least partially upright, or working, orientations relative to a surface that supports the protective cover 104.

The support element 108 may be configured to receive a peripheral portion 124 of the portable electronic device 102 (including a peripheral edge of the portable electronic device 102). Accordingly, a slot 114 may have a width (i.e., a distance between its front surface 118 and its rear surface 116) that is about the same as or greater than the thickness of the peripheral portion 124 of the portable electronic device 102. The width of the slot 114 may be configured to enable the portable electronic device 102 to be readily inserted into and removed from the slot 114. In some embodiments, the slot 114 may be configured to receive the peripheral portions 124 of a plurality of differently configured portable electronic devices 102. A configuration of the support element 108 and a configuration (e.g., a size, a shape, a weight, a weight distribution, etc.) of the protective cover 104 may hold the portable electronic device 102 in the at least partially upright orientation. In the at least partially upright orientation, a peripheral portion 126 of the portable electronic device 102 may be elevated above the protective cover 104.

In the illustrated embodiment, the support element 108 may include a slot 114 recessed in and extending laterally along at least a portion of a surface of the protective cover 104. In embodiments where the protective keyboard carries an accessory 106, the slot 114 may be located adjacent to the accessory 106. The slot 114 may be bounded by a rear surface 116, a front surface 118 and a base 120. The depth of the slot 114 is less than a thickness T of the protective cover 104; thus, the base 120 of the channel may be offset from, or located at a different elevation than, an outer surface 122 of the protective cover 104. In some embodiments, the depth of the slot 114 may be between about twenty-five percent to about seventy-five percent of the thickness T of the protective cover 104. In other embodiments, the depth of the slot 114 may be between about seventy-five percent to about ninety percent of the thickness T of the protective cover 104. In still other embodiments, the slot 114 may have a depth less than about twenty-five percent or greater than about ninety percent of the thickness T of the protective cover 104. In embodiments where the slot 114 does not extend completely across the protective cover 104, the slot 114 may extend substantially through the protective cover 104. Such a slot 114 may, therefore, lack a base 120.

As indicated previously herein, the support element 108 may be configured to support the portable electronic device 102 at an inclined angle or a perpendicular angle relative to a surface that supports the protective cover 104. The angle at which the support element 108 orients a portable electronic device 102 is represented in FIG. 2 as "angle θ," and may be defined by a number of factors, including, but not limited to, a configuration of the front surface 118 of the slot 114, an orientation of the front surface 118 of the slot 114, a configuration of the rear surface 116 of the slot 114, an orientation of the rear surface 116 of the slot 114, a distance between the front surface 118 and the rear surface 116 relative to a thickness of a portion of the portable electronic device 102 disposed within the slot 114, a depth of the slot 114, and any combination of these and/or other factors. In the embodiment depicted by FIG. 2, the rear surface 116 of the slot 114 defines at least a portion of a boundary of the slot 114 and is oriented such that the angle formed by the rear surface 116 and the base 120 is an obtuse angle. FIG. 2 also shows that the front surface 118 may be oriented at an acute angle relative to the base 120 of the slot 114.

The angle θ or angles at which a slot 114 orients a portable electronic device 102 may be defined, as desired. For instance, in some embodiments, the angle θ may be any angle from about forty-five degrees to about ninety degrees. In other embodiments, the angle θ may be any angle from about sixty degrees to about eighty-five degrees. In still other embodiments, the angle θ may be any angle from about seventy degrees to about eighty degrees. In further embodiments, the angle θ may be less than forty-five degrees or greater than ninety degrees.

In some embodiments, the slot 114 may be configured to orient a portable electronic device 102 at a plurality of different angles. As an example, a slot 114 may be configured to receive one or more inserts (not shown) that dictate the angle at which the portable electronic device 102 is oriented. As another example, a slot 114 may include different sections that are configured to orient the portable electronic device 102 at different angles from one another. Without limitation, a first section may be configured to orient a portable electronic device 102 of a first size or in a first orientation (e.g., portrait orientation) at a first angle, while second sections on opposite sides of the first section may be configured to orient a larger, second portable electronic device 102 or a portable electronic device 102 in a second orientation (e.g., landscape orientation) at a second angle.

With continued reference to FIG. 2, an embodiment of a method for causing the support element 108 (e.g., the slot 114, etc.) to engage and orient a portable electronic device 102 in an at least partially upright configuration may include orienting the portable electronic device 102 substantially perpendicular to the protective cover 104, and inserting the peripheral portion 124 of the portable electronic device 102 into the slot 114. With the peripheral portion 124 of the portable electronic device 102 in the slot 114, the portable electronic device 102 may be rotated about the peripheral portion 124 (e.g., in a counter-clockwise direction in the view provided by FIG. 2) to the illustrated inclined orientation. In such an orientation, a mechanical advantage or leverage of the portable electronic device 102 on the slot 114 may prevent or restrict additional counter-clockwise rotation of the portable electronic device 102, and even prevent movement (e.g., side-to-side movement, tilting, etc.) of the portable electronic device 102. Leverage may be created by, for instance, as features of the slot 114 engage the portable electronic device 102 at or near its peripheral portion 124, and as a rear surface 116 of the slot 114 engages at a location (e.g., a linear location, etc.) on the rear surface 116 of the portable electronic device 102.

As indicated previously herein, a configuration of the support element 108 and a configuration (e.g., a size, a shape, a weight, a weight distribution, etc.) of the protective cover 104 may hold the portable electronic device 102 in the at least partially upright orientation. Without limitation, the protective cover 104 may be weighted or otherwise configured to maintain the portable electronic device 102 in an upright position without tipping. Such weighting or other configuration may enable the protective cover system 100 to be self-supported when the protective cover 104 positions the portable electronic device 102 in an at least partially upright orientation. By way of illustration, the protective cover 104 may have sufficient mass to overcome such a moment, or may be selectively weighted to place the center of gravity of the protective cover 104 at a desirable location. For instance, the center of gravity of the protective cover 104 may be positioned near the forward side of the keyboard 110, which may counteract the moment created as the portable electronic device 102 is positioned in an at least partially upright orientation.

In some embodiments, in addition to the slot 114, which mechanically engages a peripheral portion 124 of a portable electronic device 102, a support element 108 may include additional features for securing the portable electronic device 102 in place. For instance, the support element 108 of a protective cover 104 may include one or more attachment elements 154 (e.g., magnets, etc.), which, in the illustrated embodiment, may be located adjacent to the slot 114. The attachment element may, in some embodiments, be configured to mutually engage a complementarily configured feature, or attachment element 150, at or near the peripheral portion 124 of the portable electronic device 102 (e.g., one or more corresponding magnets, etc.).

When the peripheral portion 124 of the portable electronic device 102 is placed within the slot 114, the complementary attachment elements 154 may engage (e.g., be attracted to, etc.) each other. An attraction force may therefore act to maintain the peripheral portion 124 of the portable electronic device 102 within the slot 114, although such a force may be overcome by exerting a sufficient counteracting, or removal, force. In embodiments where the attachment elements 150 and 154 comprise magnets, the polarities of the magnets may be arranged to facilitate positioning and, potentially, alignment of the portable electronic device 102 within the slot 114. A more detailed description of example embodiments of magnets and other attachment features is provided hereinafter with reference to FIGS. 3-6.

The portable electronic device 102 may be used and maintained at any number of predetermined orientations or positions relative to the protective cover 104, including the accessory 106. As discussed above, for instance, the portable electronic device 102 may be maintained in a fully or partially upright working position relative to the protective cover 104. In other embodiments, however, the portable electronic device 102 may be separated from the protective cover 104. When separated, the portable electronic device 102 may be used without the accessory 106 (e.g., the keyboard 110, etc.) of the protective cover 104, although in other embodiments the accessory 106 may still be used in connection with the portable electronic device 102 when the portable electronic device 102 and the protective cover 104 have been separated from each other. In still other embodiments, the protective cover 104 may be placed over the display surface 136 of the portable electronic device 102 so as to shield the display surface 136 and, thus, provide a protected configuration during storage or transportation of the portable electronic device 102.

It should be appreciated that the support element 108 may have any number of different configurations. For instance, while the support element 108 is illustrated as including a slot 114 recessed in a surface of the protective cover 104, the support element 108 may alternatively include features that protrude from a surface of the protective cover 104, retractable members or other elements that may be used to at least partially support a portable electronic device 102 in an at least partially upright orientation relative to a surface upon which the protective cover 104 is located.

Figure 3:
FIG. 3 is a perspective view of the embodiment of protective cover illustrated by FIG. 1, with the protective cover positioned over a display surface of the portable electronic device.

FIG. 3 illustrates an embodiment in which the protective cover 104 is oriented over and aligned with, but spaced apart from, a portable electronic device 102. An interior surface of the protective cover 104, in which the slot 114 is formed and which carries keyboard 110, are oriented towards (i.e., face) a display surface 136 of the portable electronic device 102.

Figure 4:
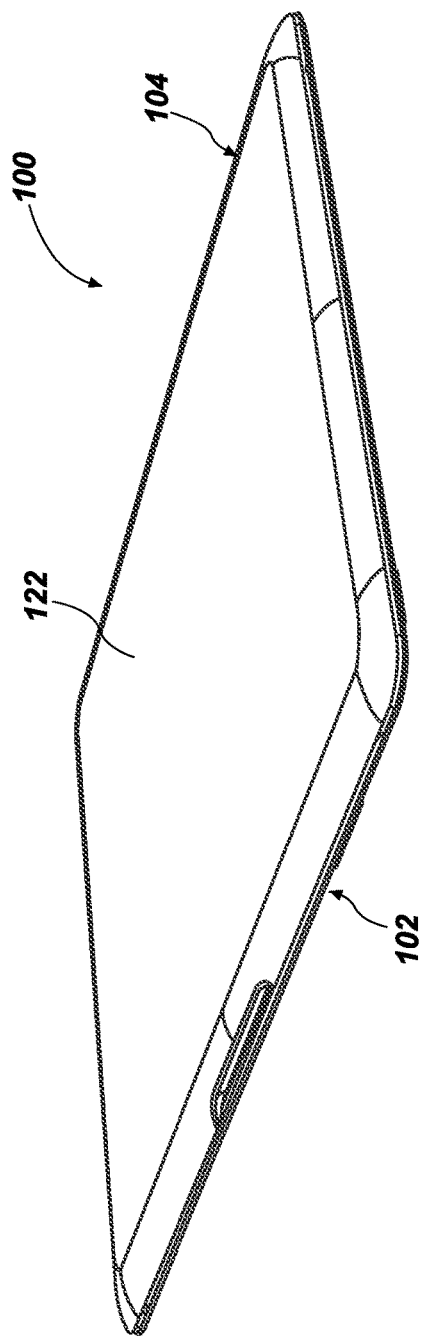
FIG. 4 is a perspective view of the embodiment of protective cover shown in FIG. 1 installed on and secured in place relative to the display surface of the portable electronic device in a closed, storage position.

With the protective cover 104 oriented adjacent to and aligned with the display surface 136 of the portable electronic device 102, the protective cover 104 may contact with the display surface 136, as shown in FIG. 4. This arrangement substantially covers or fully covers and, thus, protects the display surface 136 (FIG. 3) and, thus, places the portable electronic device 102 in a protected configuration.

Figure 5:
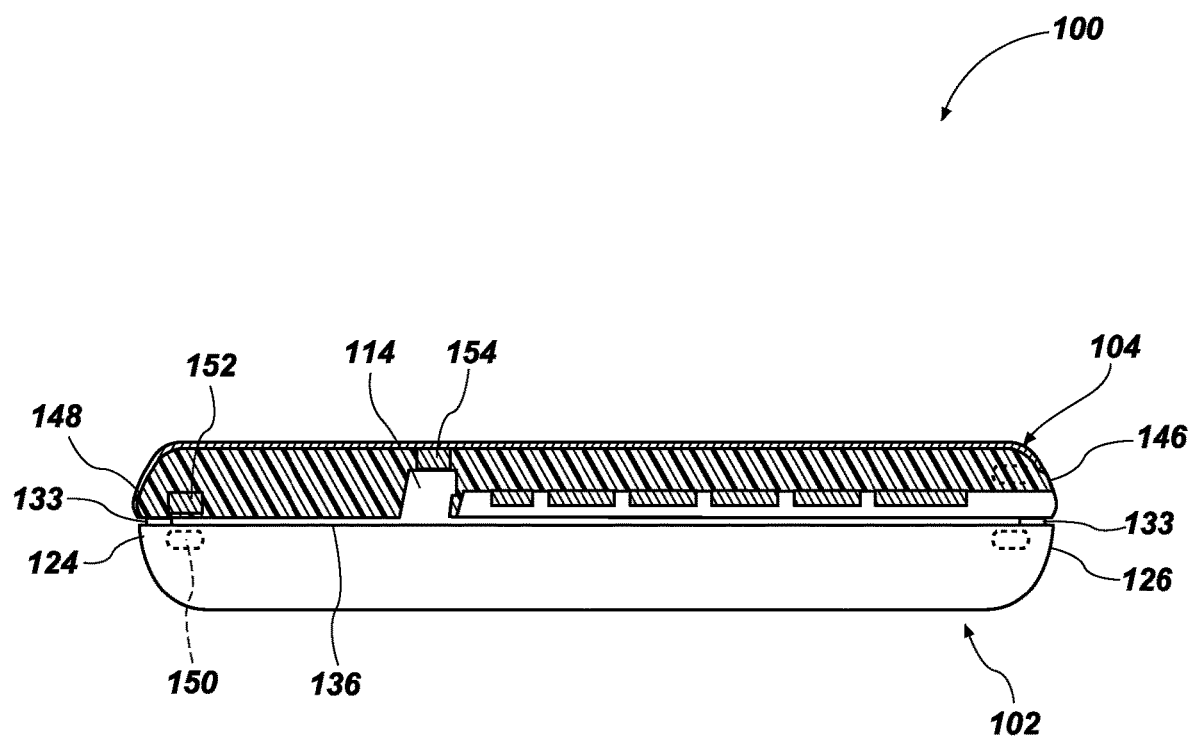
FIG. 5 is a partial cross-sectional view of the assembly depicted by FIG. 4, with the protective cover in the closed, storage position.

FIG. 5 is a partial cross-sectional view of the assembled arrangement of the embodiment of protective cover system 100 shown in FIG. 4, in which the portable electronic device 102 is protected. In accordance with some embodiments, the display surface 136 may be in contact with at least a portion of the interior surface of the protective cover 104, and can be substantially covered by the protective cover 104. As a result, while the protective cover 104 is in place, as shown in FIGS. 4 and 5, it may be difficult for an object other than the protective cover 104 to contact the display surface 136.

In addition, FIG. 5 shows that features of an accessory 106 carried by the interior surface of the protective cover 104, such as the outer surfaces of keys of a keyboard 110, may not contact the display surface 136 of the portable electronic device 102. In some embodiments, such as that depicted by FIG. 5, an outer surface of an accessory 106 of the protective cover 104 may be recessed relative to the interior surface of the protective cover 104. Alternatively, an outer surface of an accessory 106 of the protective cover 104 may be coplanar or substantially coplanar with the interior surface of the protective cover 104.

FIG. 5 illustrates aspects of an embodiment of an attachment system for securing the protective cover 104 to the portable electronic device 102, and for optionally aligning the protective cover 104 relative to the portable electronic device 102. In particular, the illustrated embodiment of illustrates a set of two attachment elements 150 and 152. A first attachment element 150 is part of (e.g., located within, etc.) or otherwise carried by the portable electronic device 102. A second attachment element 152 is part of (e.g., located within, etc.) or otherwise carried by the protective cover 104. More particularly, in the illustrated embodiment, the first and second attachment elements 150 and 152 are located at or adjacent to peripheral portions 124, 148 of the portable electronic device 102 and the protective cover 104, respectively.

In the orientation illustrated by FIG. 4, the second attachment element 152 is shown to be vertically offset from the first attachment element 150. The distance of such a vertical offset may be sufficient for attachment forces to be present between the attachment elements 150 and 152. For instance, the attachment elements 150 and 152 may comprise magnets oriented to have opposite polarities directed toward each other. Thus, the attachment element 150 may include a magnet with a North polarity directed toward the protective cover 104, while its corresponding attachment element 152 may include a magnet with a South polarity directed toward the portable electronic device 102.

In the illustrated embodiment, attachment elements 150 and 152 may be positioned at or adjacent to opposite sides of the display surface 136. In one embodiment, the attachment elements 150 and 152 may be centered relative to each other. In other embodiments, for instance, complementary attachment elements 150 and 152 may be laterally offset from one another. Such a lateral offset may be along the widths and/or lengths of the portable electronic device 102 and protective cover 104. In such an embodiment, an attraction force between the attachment elements 150 and 152 may be angled in one or more dimensions relative to the display surface 136.

While the illustrated protective cover 104 and portable electronic device 102 are shown as having about the same dimensions and footprints, another embodiment contemplates the protective cover 104 having a larger size in one or more dimensions than a portable electronic device 102 within which the protective cover 104 is configured to be used. A larger footprint may be provided by including a hinge, attachment feature, or other component that extends or is extendable at least partially outward relative to the peripheral portions 124 and 126 of the portable electronic device 102. In such an embodiment, the attachment element 152 could be included in the extended feature and be positioned outward relative to the portable electronic device 102. An attraction force between the attachment elements 150 and 152 may, in such a case, be directed fully or partially through peripheral edges of the portable electronic device 102. In other embodiments, however, such as that illustrated by FIG. 5, the attraction forces between the attachment elements 150 and 152 may be hingeless and/or directed solely through the display surface 136, without being directed through a peripheral or side surface of the portable electronic device 102.

According to embodiments in which each attachment element 150, 152 includes one or more magnets, magnetic forces may act as the primary or sole forces that secure the protective cover 104 in place over the display surface 136 of the portable electronic device 102. As used herein, terms such as "sole," "only," and the like, as well as their derivatives, when used relative to attachment forces and mechanisms, are intended to exclude consideration of more nominal factors such as sliding friction, environmental factors and other similar conditions. More particularly, an embodiment using magnets to secure the protective cover 104 to the portable electronic device 102 may be considered to use magnets as the "sole" or "only" attachment feature despite the presence of frictional, gravitational, or other similar resistance.

Where the attachment elements 150 and 152 comprise magnets, any suitable type of magnet may be used. For instance, the magnets may be permanent magnets, including rare-earth magnets. Example rare-earth magnets may include lanthanide series elements having atomic numbers 57-71. Other suitable magnets may include ceramic or ferrite magnets, AlNiCo magnets, injection-molded magnets, ferrite magnets, or any other suitable type of magnet or material with a sufficiently strong magnetic field or the ability to be attracted to a magnetic field.

Optionally, the protective cover 104 can provide protection without significantly adding to the dimensions of the portable electronic device 102. Without limiting the scope of the present disclosure, when a protective cover 104 is assembled with the portable electronic device 102 in a closed or protected arrangement, the protective cover 104 may increase a thickness of the portable electronic device 102. Nonetheless, the thickness of the resulting assembly may be minimized so as not to add significantly to the thickness of the portable electronic device 102. In some embodiments, assembly of a protective cover 104 with a portable electronic device 102 may add no more than about three-eighths of an inch (about 9.5 mm) or even less than about one quarter of an inch (about 6.4 mm) to the thickness of the portable electronic device 102. These dimensions are, however, merely examples of some suitable dimensions. For instance, in other embodiments, a protective cover 104 according to the present disclosure may add less than about three-sixteenths of an inch (about 4.8 mm) to the thickness of the portable electronic device 102, although the added thickness could in other embodiments be greater than three-eighths of an inch (about 9.52 mm).

Figure 6:
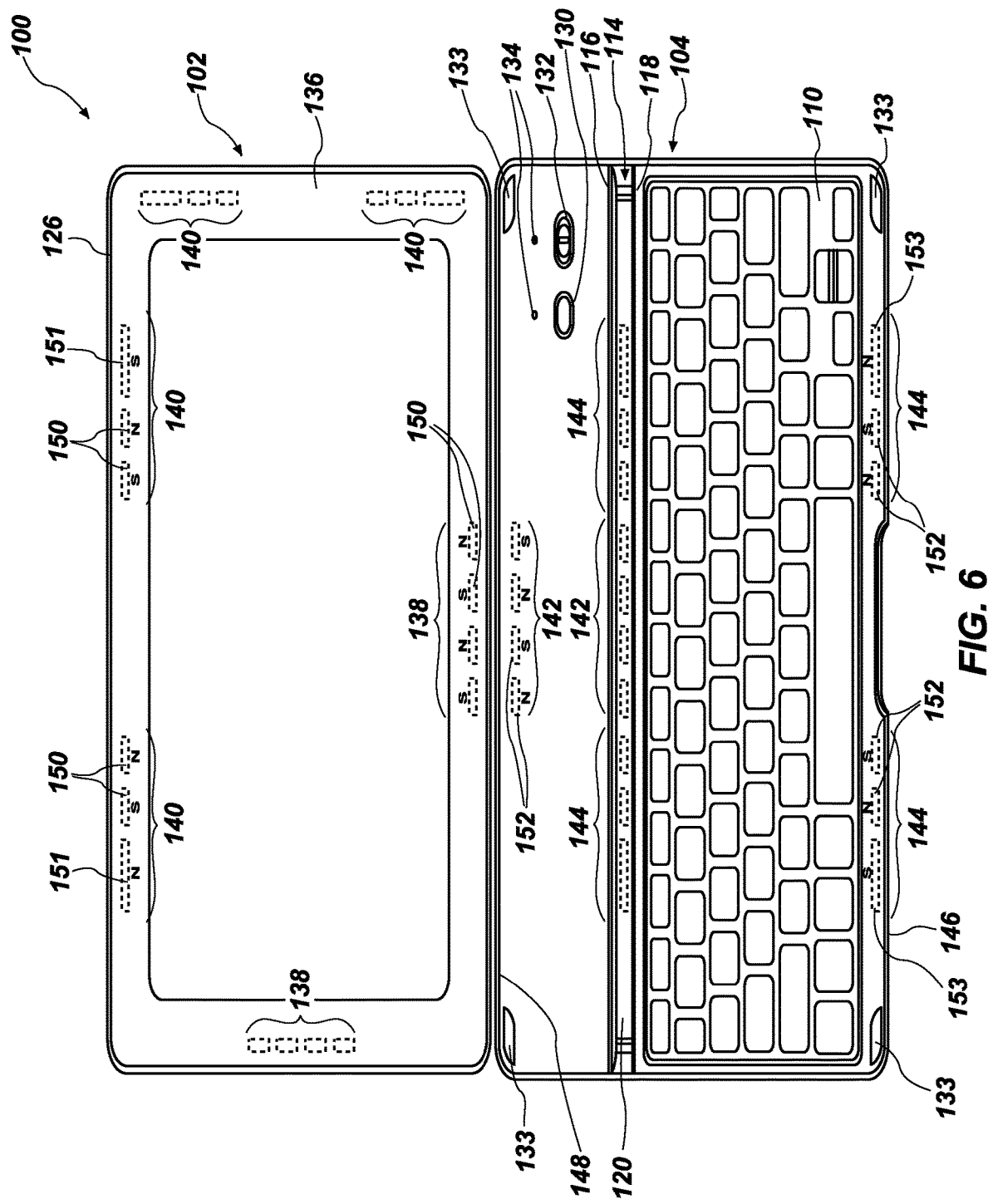
FIG. 6 is a top plan view of the embodiments of protective cover and portable electronic device illustrated by FIG. 1, arranged side-by-side and showing an embodiment of an interior surface of the protective cover, which is configured to be positioned over and against the display surface of the portable electronic device, and the display surface of the portable electronic device.

While FIG. 5 illustrates the attachment elements 150 and 152 as being positioned at or adjacent to peripheral portions 124, 148 of the portable electronic device 102 and the protective cover 104, respectively, such an embodiment is merely illustrative. In other embodiments, the attachment components 150, 152 or other features may instead or additionally be located at or adjacent to opposite peripheral portions 126 and 146 of the portable electronic device 102 and the protective cover 104, respectively. Indeed, as depicted by FIG. 6, magnets may be located at or near opposite peripheral portions 126 and 146 of both the portable electronic device 102 and the protective cover 104. In such an embodiment, the protective cover 104 may be secured in place over the display surface 136 of the portable electronic device 102 by using magnets or other components proximate each of two opposite peripheral portions of the portable electronic device 102 (e.g., at or near both peripheral portion 124 and peripheral portion 126).

Referring now to FIG. 6, the protective cover system 100 of FIGS. 1-5 is shown with the protective cover 104 being separated from the portable electronic device 102.

As shown in FIG. 6, the attachment elements 150, 152 of the portable electronic device 102 and the protective cover 104 may be arranged in groups, which are referred to herein as "attachment features." The portable electronic device 102 may include two or more attachment features 138 and 140, and the protective cover 104 may include two or more corresponding attachment features 142 and 144. Each attachment feature 138, 140, 142, 144 may include one or more components, such as attachment elements 150, 152. In accordance with one embodiment, the attachment features 138, 140, 142, 144 are configured to magnetically secure the protective cover 104 to the portable electronic device 102, to maintain the protective cover 104 in place over the display surface 136 of the portable electronic device 102 in one or more orientations or configurations, and/or to facilitate proper alignment of the protective cover 104 with the portable electronic device 102.

The illustrated attachment features 138, 140, 142, 144 may have any suitable configuration. As an example, attachment feature 138 may include four spaced apart magnets of about the same size (e.g., attachment elements 150) as one another. In contrast, attachment feature 140 may include three spaced apart magnets, optionally including magnets of different sizes (from each other, from the magnets of attachment feature 138, etc.) (e.g., attachment elements 150, 152). The attachment features 142 and 144 of the protective cover 104 may be positioned and configured to correspond to associated features of the portable electronic device 102. Thus, the attachment feature 142 may be positioned and have an arrangement that generally corresponds to the position and arrangement of attachment feature 138, while the attachment feature 144 may be positioned and arranged in a manner that generally corresponds to the position and arrangement of the attachment feature 140.

The attachment features 138 and 140 are illustrated as being located in the portable electronic device 102 and at or near a respective peripheral portion 124, 126 thereof. The attachment features 138 and 140 are shown in phantom lines as their position may be on or below the display surface 136, as shown in FIG. 5. Some or all of the attachment features 142 and 144 of the protective cover 104 may be configured to interact with corresponding attachment features 138 and 140 of the portable electronic device 102. In particular, in the illustrated embodiment, the protective cover 104 is illustrated as including two attachment features 144 at or near a peripheral portion 146, and one attachment feature 142 at or near a peripheral portion 148 of the protective cover 104.

If the protective cover 104 is flipped over from the illustrated view and placed over the display surface 136 of the portable electronic device 102 (see FIG. 3), the attachment features 138 of the portable electronic device 102 may be aligned with the corresponding attachment feature 142 of the protective cover 104. Similarly, the other attachment feature 140 of the portable electronic device 102 may be aligned with the corresponding attachment feature 144 of the protective cover 104. According to some embodiments, when the attachment features 138 and 140 are aligned with corresponding attachment features 142 and 144, the adjacent attachment features 138 and 142, 140 and 144 may engage each other (e.g., magnetically, etc.) To hold the interior surface of the protective cover 104 against the display surface 136 of the portable electronic device 102.

In accordance with a specific embodiment, an attachment feature 138, 140, 142, 144 may include multiple magnets, and different magnets in the same attachment feature 138, 140, 142, 144 may have an opposite polarity. Thus, one magnet may have be oriented in one direction (e.g., a North pole oriented towards the display surface 136 of the portable electronic device 102 or towards the interior surface of the protective cover 104, etc.) while one or more other magnets have an opposing orientation (e.g., a South pole oriented towards the corresponding display surface 136 or interior surface of the protective cover 104, etc.). In some cases, adjacent magnets have opposite polarities.

FIG. 6 illustrates an embodiment in which the attachment features 138, 140, 142, 144 include magnets that have opposing polarities. As an example, the attachment feature 138 of the portable electronic device 102 includes magnets (i.e., an embodiment of attachment element 150) of alternating polarity (e.g., South/North/South/North, etc.). Similarly, the complementary attachment feature 142 of the protective cover 104 may also include magnets of alternating polarity (e.g., North/South/North or South/North/South). According to at least some embodiments, the arrangements of polarities of magnets of the attachment features 142 and 144 of the protective cover 104 (e.g., North/South/North/South) may be opposite and, thus, complementary to (as opposite magnetic polarities attract) the arrangement of polarities of corresponding attachment features 138 and 140 of the portable electronic device 102 (e.g., South/North/South/North). Such an embodiment is generally illustrated in FIG. 6.

Inasmuch as same polarities repel, the alternating or otherwise varying polarities of the attachment elements 150-153 may facilitate alignment of the protective cover 104 relative to the portable electronic device 102. More particularly, two magnets having the same polarity (e.g., South/South or North/North) repel each other. Such repulsion may resist or even prevent the protective cover 104 being secured in a misaligned position over the display surface 136 of the portable electronic device 102. Optionally, a repellent force may help shift the position of the protective cover 104 relative to the portable electronic device 102 to align two opposite polarity magnets (e.g., North/South or South/North). In some embodiments, repellant forces assist in repositioning the protective cover to a natural position where attraction forces facilitate attachment (e.g., where no magnets are opposed to a corresponding magnet of the same polarity, etc.).

In some embodiments, the protective cover 104 may be an after-market product or otherwise available to correspond to a particular type (e.g., brand, model, etc.) of portable electronic device 102. The attachment features 142, 144 of the protective cover 104 may be configured specifically for use with (e.g., complementary to, etc.) the configuration of attachment features 138, 140 of that particular type of portable electronic device 102.

In addition to the attachment features 142, 144 being used to attach the protective cover 104 over the display surface 136 of the portable electronic device 102, the attachment features 142, 144 may also provide additional or other functionality. For instance, when the portable electronic device 102 is positioned in an orientation such as that illustrated by FIGS. 4 and 5, the portable electronic device 102 may not be configured for use (i.e., its display is not accessible). The portable electronic device 102 may, for instance, have a sleep mode or powered-down mode that can be activated when the protective cover 104 is properly positioned over the display screen 136 of the portable electronic device 102. Interaction between one or more attachment features 142, 144 of the protective cover 104 and one or more corresponding attachment features 138, 140 of the portable electronic device 102 may disable use of the portable electronic device 102 (e.g., through a "sleep" mode, by powering down, or turning off power, etc.) in a manner known in the art and, thus, conserve power.

Conversely, when the peripheral portion 124 of the portable electronic device 102 is engaged by the slot 114, interaction between the attachment features 138, 140 of the portable electronic device 102 and an attachment feature 142, 144 of the protective cover 104 adjacent to the slot 114 may activate the portable electronic device 102 (e.g., "wake" it, power it up, etc.).

The accessory 106 may include other or additional features, such as a power control input 132, an embodiment of which is also shown in FIG. 6. The power control input 132 may be used to place the accessory 106 in an on or off state. Such a power control input 132 may be linked to a power supply (e.g., AC power supply, DC battery, etc.) to selectively provide power to processors, communication busses, circuit components, or other features that may use power to operate. In some embodiments, the accessory 106 may include a keyboard 110 as described herein, and power may be required to transfer signals produced using the keyboard 110, to power backlighting in the keyboard 110, or for other purposes. The power control input 132 may take the form of a button, switch, toggle, or other component, or any combination of the foregoing. Where the power control input 132 is a toggle or switch, a user may move the toggle or switch between at least two positions, including an "off" position and an "on" position. When the power control input 132 is in the "on" position, the accessory 106 may be able to use power to operate various components, including the keyboard 110.

While the accessory 106 is illustrated as including a keyboard 110, the accessory 106 may include any number of additional or other devices or features. For instance, other accessories usable in connection with embodiments of the present disclosure may include any combination of: batteries or other power sources configured to provide primary or backup power for a computing device; audio devices (e.g., speakers, microphones, turntables, mixers, etc.); printers; scanners; peripheral storage or memory devices (e.g., disk drives, hard drives, solid state storage devices, etc.); communication elements configured to provide a computing device with alternate and/or additional means of communication (e.g., USB or USB micro ports, HDMI ports, FireWire interfaces, i.LINK interfaces, Lynx interfaces, 8P8C jacks, etc.); or other devices or accessories or any combination of the foregoing.

An additional aspect illustrated in FIG. 6 is a cushioning feature 133. The cushioning feature 133 may be provided to engage the display surface 136 when the portable electronic device 102 is in a closed or storage configuration. The cushioning feature 133 may therefore be located on an interior surface of the protective cover 104. As discussed herein, the protective cover 104 may be placed over the display surface 136 of the portable electronic device 102.

The cushioning features 133 may be formed and located so as to absorb any shock generated by impact on the protective cover 104, or to reduce the total surface area over which contact occurs between the display surface 136 and the protective cover 104. Thus, in the illustrated embodiment, four cushioning features 133 are shown at positions to correspond to the corners of the display surface 136 of the portable electronic device 102. In some embodiments, the cushioning features 133 may be located at one or more positions that correspond to a bezel or other location rather than to a display screen on the display surface 136, although the cushioning features 133 could also be located to contact the display screen.

The cushioning features 133 may comprise a compressible, resilient material. A variety of materials possess desirable characteristics for the cushioning features 133. These materials include, but are not limited to, ethylene-vinyl acetate (EVA) foam (which is commonly referred to as "foam rubber" and as "expanded rubber"), polyurethane foam (e.g., microcellular polyurethane foam; fine-celled, low compression-set, high density polyurethane foam; etc.), neoprene and a variety of other compressible, resilient materials. In some embodiments, the protective cover 104 may include a liner or cushioning material covering all or a substantial portion of an interior surface thereof, and such a material may engage against the display surface 136, including the display screen, of the portable electronic device 102 and absorb shock generated by impact on the protective cover 104 or the portable electronic device 102.

As will be appreciated in view of the disclosure herein, the accessory 106 may include other aspects, take other forms, or have other components or features. For instance, one or more ports or other inputs may be provided. As an example, the accessory 106 may use an additional or alternative wired connection (e.g., USB, serial, etc.) that is configured to communicatively couple the keyboard 110 to a power source and/or to an electronic device. A port or input may be provided to allow power to be provided or to allow communication to be provided to the electronic device. Still other ports, inputs, outputs, and the like may also be provided. As an example, an input to selectively turn backlighting on or off may be included. Additionally, or alternatively, inputs to change communication protocols may be provided. In some embodiments, indicators 134, such as lights or other components may be provided as outputs. Such indicators 134 may show a status of certain features, including connectivity, power, backlighting, or other status of the accessory 106.

Although the foregoing description provides many specifics, these should not be construed as limiting the scope of any of the appended claims, but merely as providing information pertinent to some specific embodiments that may fall within the scopes of the appended claims. Other embodiments of the disclosed subject matter may also be devised which lie within the scopes of the appended claims. In addition, features from different embodiments may be employed in combination. The scope of each claim is indicated and limited only by its plain language and the legal equivalents to its elements. All additions, deletions, and modifications to the subject matter disclosed herein that fall within the scopes and meanings of the claims are to be embraced by the claims.

What is claimed:

1. A keyboard for use with a plurality of differently configured devices from different manufacturers or having different capabilities, comprising:
a support with a support element consisting essentially of a slot bounded by a forward surface and an opposed rear surface, the forward surface and the opposed rear surface being planar surfaces oriented parallel to one another and spaced apart a distance that enables the slot to receive peripheral edges of any of the plurality of differently configured devices from different manufacturers or having different capabilities, the forward surface and the opposed rear surface located a single fixed distance apart from one another, enabling the slot to self-support the plurality of differently configured devices from different manufacturers or having different capabilities in working positions relative to a keyboard.

2. The keyboard of claim 1, wherein the forward surface and the opposed rear surface enable the slot to self-support the plurality of differently configured devices from different manufacturers or having different capabilities at angles of about 60° to about 85° to the keyboard.

3. The keyboard of claim 1, further comprising:
a device retention element complementary to an attachment element of a device of the plurality of differently devices from different manufacturers or having different capabilities to prevent a peripheral edge of the device from sliding laterally relative to the slot.

4. The keyboard of claim 3, wherein the device retention element and the attachment element associated with a display surface of the device can engage each other.

5. The keyboard of claim 4, wherein the device retention element consists of one or more magnets.

6. A keyboard for use with a plurality of differently configured devices from different manufacturers or having different capabilities, comprising:
a base, including:
a support with a support element consisting essentially of a slot formed in an interior surface of the base, the slot including a forward surface and an opposed rear surface, the forward surface and the opposed rear surface being planar surfaces oriented parallel to one another and located a single fixed distance apart from each other, enabling the slot to:
receive a peripheral edge of a device of any of the plurality of differently configured devices from different manufacturers or having different capabilities; and
hold the device, with the forward surface and the opposed rear surface engaging respective front and rear surfaces of the device adjacent to the peripheral edge; and
the keyboard carried by the base.

7. The keyboard of claim 6, wherein the forward surface and the opposed rear surface enable the slot to hold the device in a working orientation relative to the keyboard.

8. The keyboard of claim 7, wherein the forward surface and the opposed rear surface enable the slot to hold the device in the working orientation at an angle of about 45° to about 85° to the base.

9. The keyboard of claim 6, further comprising:
a device retention element complementary to an attachment element of the device to prevent the peripheral edge of the device from sliding laterally relative to the slot.

10. The keyboard of claim 9, wherein the device retention element and the attachment element associated with the display surface of the device can engage each other.

11. The keyboard of claim 10, wherein the device retention element consists of one or more magnets.

12. A protective cover for use with a plurality of differently configured devices from different manufacturers or having different capabilities, comprising:
a base; and
a support associated with the base and including a support element consisting essentially of a slot, the slot including a forward surface and an opposed rear surface, the forward surface and the opposed rear surface being planar surfaces oriented parallel to one another and spaced apart a single fixed distance that enables the slot to:
receive a peripheral edge of a device of any of the plurality of differently configured devices from different manufacturers or having different capabilities;
hold the device, with the forward surface and the opposed rear surface of the slot engaging respective front and rear surfaces of the device adjacent to the peripheral edge; and
self-support the device in a working orientation relative to the base.

13. The protective cover of claim 12, further comprising:
a device retention element complementary to an attachment element of the device to prevent the peripheral edge of the device from sliding laterally relative to the slot.

14. The protective cover of claim 13, wherein the device retention element and the attachment element associated with a display surface of the device can engage each other.

15. The protective cover of claim 14, wherein the device retention element consists of at least one magnet.

16. The protective cover of claim 12, wherein the forward surface and the opposed rear surface enable the slot to hold the device in the working orientation at an angle of about 45° to about 85° to the base.

17. The protective cover of claim 12, further comprising:
a keyboard carried by the base.

* * * * *